United States Patent

Finger

[15] 3,704,431

[45] Nov. 28, 1972

[54] COULOMETER CONTROLLED VARIABLE FREQUENCY GENERATOR

[72] Inventor: Eugene P. Finger, Brewster, N.Y.

[73] Assignee: Curtis Instruments, Inc., Mount Kisco, N.Y.

[22] Filed: July 21, 1971

[21] Appl. No.: 164,677

[52] U.S. Cl...................331/177 R, 324/94, 328/127, 332/30

[51] Int. Cl...............................................H03b 3/00

[58] Field of Search......331/177 R; 324/94; 328/127; 332/30

[56] References Cited

UNITED STATES PATENTS 3,255,413 6/1966 Marwell et al...............324/94

*Primary Examiner*—John Kominski
*Attorney*—Dean S. Edmonds et al.

[57] ABSTRACT

A variable frequency generator utilizing a coulometer for generating a signal having an amplitude that varies in accordance with the integral of a selected function. A DC current source and a variable frequency interrogation oscillator are connected to the input terminals of a coulometer which modulates the output of the oscillator in accordance with the integral of the current from the current source. The output of the coulometer is amplified by an AC amplifier and is then demodulated by a standard envelope detector. The demodulated signal is fed back to the oscillator to proportionally control the frequency of the oscillator, that is, as the amplitude of the modulated signal increases, the frequency of the oscillator increases and, as the amplitude of the demodulated signal decreases, the frequency of the oscillator decreases.

6 Claims, 8 Drawing Figures

INVENTOR
EUGENE P. FINGER

BY
Pennie, Edmonds, Morton, Taylor & Adams
ATTORNEYS

INVENTOR
EUGENE P. FINGER

BY
Pennie, Edmonds, Morton, Taylor & Adams
ATTORNEYS

COULOMETER CONTROLLED VARIABLE FREQUENCY GENERATOR

BACKGROUND OF THE INVENTION

This invention relates to a variable frequency oscillator utilizing a coulometer to derive a frequency control signal having an amplitude that varies in accordance with the integral of a selected function.

In many applications in present day electronic systems, such as in computer systems, there is a need for variable frequency generators which can be controlled electronically in accordance with some predetermined function. Typically, such devices have been very complex and expensive. More specifically, known circuits for generating a variable frequency signal in accordance with a prescribed function have been less than adequate because they typically have not been capable of generating frequencies in accordance with more than one prescribed function and, therefore, have lacked the flexibility required for many present day applications.

It, therefore, is an object of this invention to provide a variable frequency oscillator which may be controlled in accordance with any of a plurality of selected functions.

It is another object of this invention to provide a variable frequency oscillator which is economical and has a relatively simple structure.

SHORT STATEMENT OF THE INVENTION

A current source and a variable frequency interrogation oscillator are to a means such as a coulometer for modulating the output of the oscillator in accordance with the integral of the current. The modulated output is amplified by an AC amplifier and is then demodulated by an envelope detector. The demodulated signal is then fed back to the oscillator to control the frequency of the oscillator proportionally to the amplitude of the demodulated signal.

BRIEF DESCRIPTION OF THE DRAWINGS

Other objects, advantages and features of this invention will become more fully apparent from the following detailed description, appended claims and accompanying drawings in which:

DETAILED DESCRIPTION

Figures 1, 2, 3:
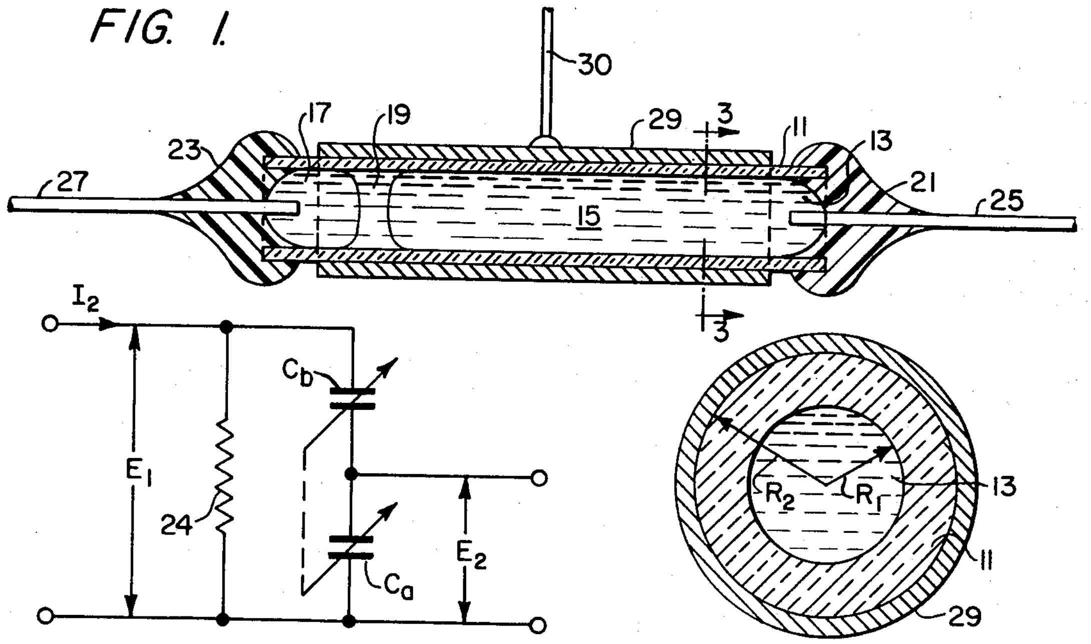
FIG. 1 shows a simplified section view of the coulometer utilized in this invention.
FIG. 2 is a diagram of the equivalent circuit of a coulometer of FIG. 1.
FIG. 3 is a cross-sectional view of the coulometer of FIG. 1 taken along the lines 3—3 thereof.

FIG. 1 shows a simplified section view of a coulometer such as utilized in the present invention and which is illustrated in U.S. Pat. No. 3,255,413 issued to E. M. Marwell et al. A tube 11 comprised of non-conductive material such as glass, ceramics, epoxy resin or the like, has a capillary bore 13 into which is placed a pair of liquid metal columns 15 and 17. The columns which may be comprised of mercury, for example, extend inwardly from the opposite ends of the tube and are separated at their innermost ends by a small volume of an electrolyte 19 which is maintained in conductive contact with both columns. A suitable electrolyte may be a water solution of potassium iodide and mercuric iodide.

The bore 13 is sealed at both ends by epoxy resin seals 21 and 23 as illustrated. Electrical contact with the respective metal columns is provided by conductive leads 25 and 27, the innermost ends of which are immersed in the mercury columns. The conductive leads are preferably made of a metal, such as, for example, nickel which does not chemically combine with the mercury in the bore.

A conductive sheath 29 is secured to the outer surface of tube 11 along substantially the full length thereof and an electrically conductive lead 30 is attached thereto for permitting conduction of electrical signals with respect to the sheath 29. Conductive epoxy resin has been found to be a satisfactory sheath material, but it should be understood that any suitable electrical conductor disposed around the exterior surface of the body may be used as an alternative.

Refer now to FIG. 2 which shows a schematic diagram of the equivalent circuit of the coulometer illustrated in FIG. 1. The capacitance between mercury column 15 and sheath 29 is represented by a capacitor $C_a$ and the capacitance between column 17 and sheath 29 is represented by a capacitor $C_b$. As the capacitance of $C_a$ increases, the capacitance of $C_b$ decreases, and, as capacitance $C_a$ decreases, the capacitance of $C_b$ increases correspondingly. Thus, the capacitors are in a ganged differential form which is represented by the dotted line in the figure. Additionally, the coulometer has a small resistance provided mainly by the electrolyte 19. This resistance is represented by resistor 24 which is connected in parallel across the capacitors $C_a$ and $C_b$. It should be recognized that the coulometer instrument illustrated in FIG. 1 electrically functions as a capacitive potentiometer which when electrically energized with an AC voltage divides the voltage as a linear function of the value of the output capacitor $C_a$.

The transfer characteristics of the coulometer, that is, $E_2$ relative to the input current $I_s$ will now be developed. The displacement of the gap formed by the electrolyte 19 with respect to either end of the tube 11 is linearly related to the number of coulombs passing through the coulometer from lead 25 to lead 27. More specifically, a variable current $I_s$ maintained for a period of time T transfers m grams of material, i.e., the liquid metal, having a molecular weight W and valence $\alpha$ through the electrolyte 19 in accordance with Faraday's Law. This may be represented by the following mathematical formulation:

$$m=\frac{W}{\alpha F}\int_0^T I_s dt \qquad (1)$$

where $F$ equals 96,494 coulombs. If, for example, liquid mercury having a density $\rho$ is transferred in the capillary bore 11 which has a diameter $d$, the gap displacement L, i.e., the length of mercury column, can be computed as follows:

$$(\text{volume of mercury in a column}) = m/\rho = \tfrac{1}{4}d^2 L \quad (2)$$

This may be transposed so that $$L = 4m/\rho\pi d^2 \quad (3)$$

and, therefore, by substituting equation (3) into equation (1) the following formula is derived:

$$L = \frac{4w}{\rho a \pi d^2 F} \int_0^T I_s dt = K_1 \int_0^T I_s dt \quad (4)$$

where $K_1$ is a constant.

It thus can be seen that the gap displacement $L$ from either end of the tube 11 of the coulometer is proportional to the integral of the current passing through the coulometer.

Refer now to FIG. 3 which shows a cross sectional view of the coulometer of FIG. 1 taken along the line 3—3 thereof. The tube 11 is shown separating a conductive sheath 29 from the bore 13 which contains a liquid metal, such as, mercury. The bore 13 is shown having a radius $R_1$ and the conductive sheath is shown having a radius $R_2$. The capacitance between the conductive sheath 29 and the mercury in the bore 13 may be represented by the following well-known formula:

$$C = 0.241\ E_r L/\log(R_2/R_1)\ Pf = K_2 L\ Pf \quad (5)$$

where the gap displacement, i.e., the length of the mercury column, is L and $E_r$ is the relative capacitivity of the tube 11. It can be seen that the capacitance between the mercury column of the coulometer and the conductive sheath 29 is directly proportional to the displacement of the gap with respect to one of the ends of the coulometer. Accordingly, the capacitance between the mercury column and the outer sheath is proportional to a constant times the integral of the current passing through the coulometer. This may be represented as follows:

$$C = K_3 \int_0^T I_s dt \quad (6)$$

The output transfer function of the coulometer integrator can now be developed. With reference to FIG. 2, the following formula represents the output transfer function:

$$E_2 = \frac{\frac{1}{SC_a}}{\frac{1}{SC_a} + \frac{1}{SC_b}} E_1 = \frac{C_b}{C_a + C_b} E_1 \quad (7)$$

where S is the LaPlace operator. Since the total capacitance is always constant for a given coulometer, equation (7) may be simplified $$E = (C_b/C_t\ E_t \quad (8)$$

where $C_t$ is the total capacitance and is a constant. Thus, combining the above equation with equation (6) the output $E_2$ can be represented by $$E_2 = K_1 K_4 \int_0^T I_s dt \quad (9)$$

It thus can be seen that the output $E_2$ of the coulometer is directly proportional to the integral with respect to time of the current passing through the coulometer multiplied by the voltage across the coulometer.

Figure 4:
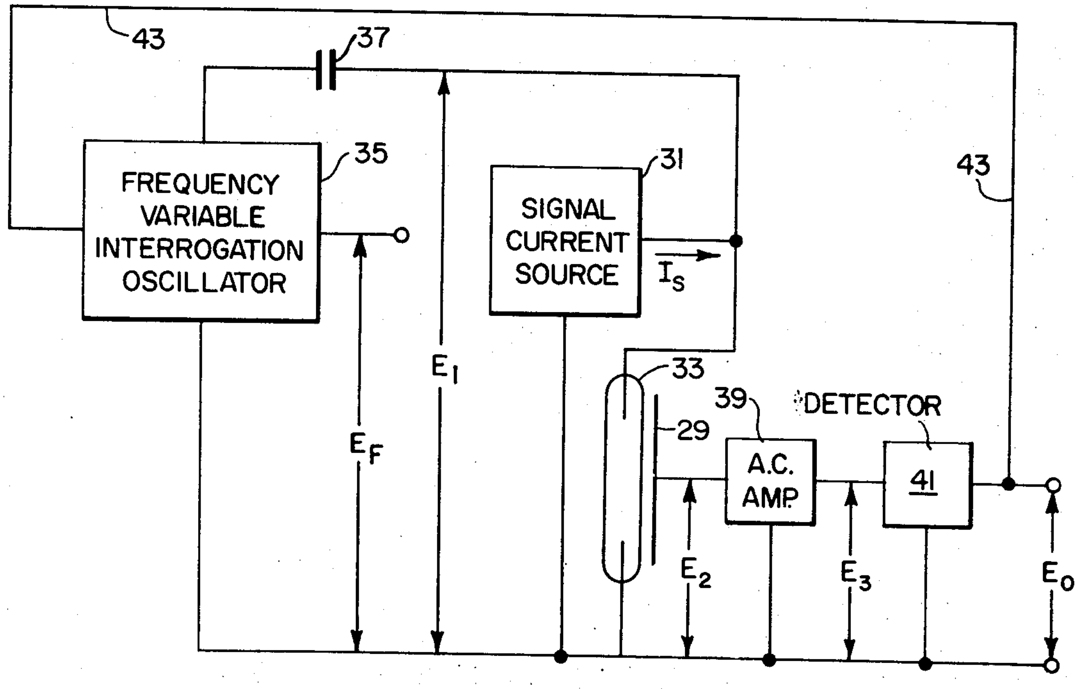
FIG. 4 is a schematic diagram of the preferred embodiment of the invention.
Figure 5A:
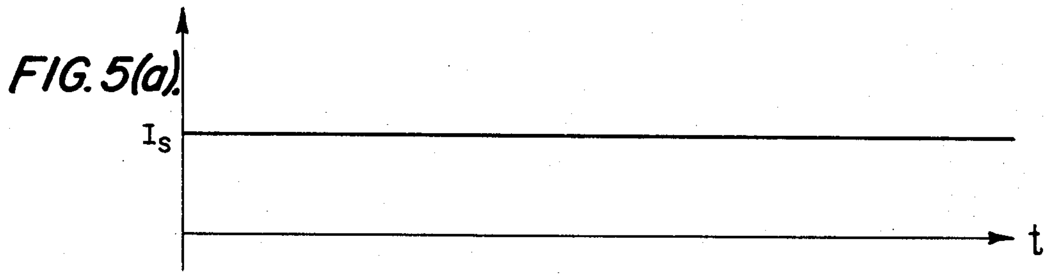
FIG. 5(a) is a graphical display of the output of the signal current source of the invention.
Figure 5B:
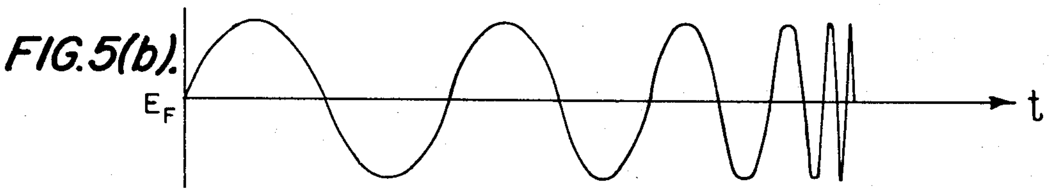
FIG. 5(b) is a graphical display of the output of the variable frequency interrogation oscillator of the invention.
Figure 5C:
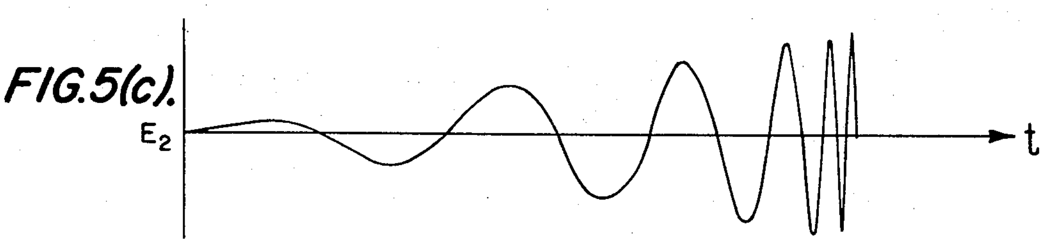
FIG. 5(c) is a graphical display of the output of the coulometer of the invention.
Figure 5D:
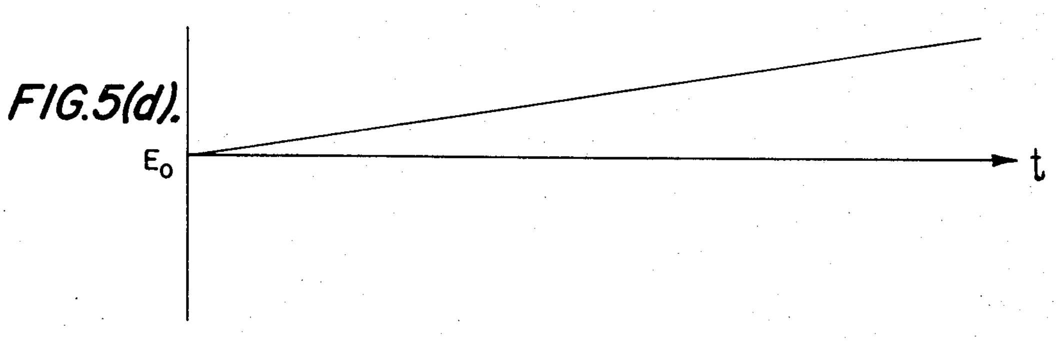
FIG. 5(d) is a graphical display of the output of the detector of the invention.

FIG. 4 shows a schematic diagram of the preferred embodiment of the invention. A signal current source or function generator 31 having a substantially infinite output impedance is shown connected to a coulometer 33 which is of the type previously described. The current source 31 may have any desired output waveform depending on the way in which the generated output frequency is to vary. Also connected to coulometer 33 is a variable frequency interrogation oscillator 35. Interrogation oscillator 35 preferably has an output impedance approaching zero so that it appears to the coulometer as a constant voltage source. The output of the interrogation oscillator is connected through a blocking capacitor 37 to the coulometer with the capacitor 37 performing the function of blocking the DC current of source 31 from feeding into the output of the oscillator. The output of the oscillator is modulated by the coulometer in accordance with the integral of the current input from source 31 as previously described.

The output of the coulometer 33 is connected to an AC amplifier 39 for amplification, the output of which is then demodulated in a typical detector or amplitude demodulator 41. The demodulated output of the detector 41 is fed back to the variable frequency interrogation oscillator 35 along line 43 for adjusting the output frequency thereof in accordance with the amplitude of the demodulated signal. Thus, as the output of detector 41 increases, the frequency of the signal generated by oscillator 35 increases proportionately.

Refer now to FIG. 5 which shows the waveforms associated with the circuit shown in FIG. 4. FIG. 5(a) shows the output of signal current source 31 which is a constant current. It should be understood, however, that the waveform of the electrical current function from the source 31 may be of any shape and will depend upon the application to which the frequency generator will be used. FIG. 5(b) shows the output of variable frequency interrogation oscillator 35 which as shown is a frequency modulated signal with the frequency increasing in accordance with the integral of the current from source 31, i.e., linearly with time. These signals are fed to the coulometer 33 which integrates the current signal and modulates the oscillator output in accordance with the integral of the current. This waveform is shown in FIG. 5(c) and is an amplitude and frequency modulated signal. As shown, the envelope of the voltage at the output of the coulometer varies in accordance with the integral of the current from source 31 which envelope is a linear ramp function since the current signal is constant with respect to time. The frequency of the output of the coulometer also varies in accordance with the integral of the current form source 31, and as shown is linear with respect to time since the current is constant with respect to time. It should be understood, however, that the frequency and the amplitude of the output of the coulometer may be made to vary in any given fashion depending upon the waveform of the current function from source 31. THe signal output of coulometer 33 is amplitude demodulated by detector 41, the output of which is shown in FIG. 5(d). The waveform as shown in FIG. 5(d) is a linearly rising ramp function which is the envelope of the output of the coulometer 33 and consequently is the integral of the current being fed to the coulometer 33. This constantly rising signal is fed to the variable frequency interrogation oscillator 35 and adjusts the frequency thereof in accordance with he amplitude of the output of the detector 41. Accordingly, the frequency increases linearly with time.

The variable frequency oscillator 35 may be of any suitable type. Thus, for example, if it is desired that the output frequency of the oscillator vary linearly with the output from detector 41, the oscillator should be of the type having a means for linearly varying its frequency with respect to the amplitude of an input signal. It should be understood, however, that other circuits could be utilized for producing an output that varies exponentially with respect to an input signal. Thus, for example, a typical LC controlled oscillator may be utilized wherein the capacitor may be a voltage variable capacitor which is controlled by the output of the detector.

The output waveform of the variable frequency interrogation oscillator may be of any suitable form, such as, for example, a sinusoidal wave or a square wave and may have a wide range of frequencies since the coulometer 33 is typically capable of modulating signals over frequency spectrum ranging from a KHz to a MHz. Thus, it can be seen that by utilizing a coulometer modulating device a very flexible and simplified variable frequency generator may be designed utilizing a minimum of power for operating.

The foregoing description is of the preferred embodiment of the variable frequency generator of this invention. It should be understood however that certain modifications may be made within the spirit and scope of the invention as defined by the appended claims.

I claim:

1. A variable frequency generator comprising means for generating an AC signal, means for generating an electric current function, means for modulating said AC signal by the integral of said current function, means for demodulating said modulated signal, said demodulated signal having an amplitude that is proportional to the envelope of said AC signal multiplied by the integral of said current function, and feedback means for varying the frequency of said AC signal in accordance with said demodulated signal.

2. The generator of claim 1 wherein said means for modulating said AC signal comprises a capacitive coulometer.

3. The circuit of claim 2 wherein said coulometer comprises an output capacitance, means for varying said output capacitance in accordance with the integral of said current function, means for connecting said AC signal generating means to said coulometer, and means for detecting said AC signal across said output capacitance.

4. The generator of claim 3 wherein said means for varying the frequency of said AC signal includes feedback means for connecting the output of said demodulating means to AC signal generating means, said AC signal generating means generating a signal having a frequency that varies proportionately as the demodulated signal.

5. A method of generating a variable frequency signal comprising the steps of generating an electrical function, modulating an AC signal in accordance with the integral of said current function, demodulating said modulated signal to provide a waveform having an amplitude proportional to the integral of said current function multiplied by said AC signal, and varying the frequency of said AC signal in accordance with said demodulated signal.

6. The method of claim 5 wherein said step for modulating said AC signal in accordance with the integral of said current function comprises the steps of deriving the integral of said current function and modulating said AC signal by the integral of said current.

* * * * *